(12) United States Patent
Sekiguchi et al.

(10) Patent No.: US 7,582,921 B2
(45) Date of Patent: Sep. 1, 2009

(54) SEMICONDUCTOR DEVICE AND METHOD FOR PATTERNING

(75) Inventors: Tomonori Sekiguchi, Tokyo (JP); Toshihiko Tanaka, Tokyo (JP); Toshiaki Yamanaka, Saitama (JP); Takeshi Sakata, Tokyo (JP); Katsutaka Kimura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 400 days.

(21) Appl. No.: 11/504,738

(22) Filed: Aug. 16, 2006

(65) Prior Publication Data

US 2006/0273405 A1 Dec. 7, 2006

Related U.S. Application Data

(63) Continuation of application No. 10/282,044, filed on Oct. 29, 2002, now Pat. No. 7,105,873, which is a continuation of application No. 09/342,239, filed on Jun. 29, 1999, now Pat. No. 6,495,870.

(30) Foreign Application Priority Data

Jul. 3, 1998 (JP) .................................. 10-188518

(51) Int. Cl.
H01L 27/10 (2006.01)
(52) U.S. Cl. .................. 257/202; 257/203; 257/208; 257/E27.105
(58) Field of Classification Search ............... 257/202, 257/203, 208, E27.105
See application file for complete search history.

(56) References Cited

U.S. PATENT DOCUMENTS

| 4,287,571 | A | 9/1981 | Chakravarti et al. |
|---|---|---|---|
| 5,321,280 | A | 6/1994 | Sakai |
| 5,391,901 | A | 2/1995 | Tanabe |
| 5,801,406 | A * | 9/1998 | Lubow et al. ............... 257/202 |
| 5,801,983 | A | 9/1998 | Saeki |
| 5,844,842 | A | 12/1998 | Seki et al. |
| 5,903,022 | A | 5/1999 | Takashima et al. |
| 5,990,507 | A | 11/1999 | Mochizuki et al. |
| 6,108,232 | A | 8/2000 | Hennebois et al. |
| 6,274,928 | B1 | 8/2001 | Casper et al. |

FOREIGN PATENT DOCUMENTS

| JP | 1-13290 | 1/1989 |
|---|---|---|
| JP | 1-309325 | 12/1989 |
| JP | 06-151765 | 5/1994 |
| JP | 06-180498 | 6/1994 |
| JP | 07-183301 | 7/1995 |
| JP | 07-211617 | 8/1995 |
| JP | 08-204016 | 8/1996 |
| JP | 8-330536 | 12/1996 |
| JP | 08-340089 | 12/1996 |

(Continued)

*Primary Examiner*—Phat X Cao
(74) *Attorney, Agent, or Firm*—Mattingly & Malur, P.C.

(57) ABSTRACT

In a masking pattern (a) for patterning word and data lines, length is changed between adjacent word lines so as to be shifted from each other at their tips, and furthermore, the tip of each word line is cut obliquely. It is thus possible to prevent the resist pattern from separation and contact of adjacent patterns. Consequently, it is also possible to prevent break failures of patterned lines and short failures between those patterned lines.

8 Claims, 16 Drawing Sheets

FOREIGN PATENT DOCUMENTS

| | | |
|---|---|---|
| JP | 9-082710 | 3/1997 |
| JP | 09-082710 | 3/1997 |
| JP | 9-107076 | 4/1997 |
| JP | 9-219504 | 8/1997 |
| JP | 9-307075 | 11/1997 |
| JP | 9-326481 | 12/1997 |
| JP | 9-331030 | 12/1997 |
| JP | 10-56085 | 2/1998 |

* cited by examiner 0.18
0.32
0.53

SEMICONDUCTOR DEVICE AND METHOD FOR PATTERNING

CROSS REFERENCES

This is a continuation of application Ser. No. 10/282,044 filed Oct. 29, 2002 now U.S. Pat. No. 7,105,873, which is a continuation of Ser. No. 09/342,239, filed Jun. 29, 1999 now U.S. Pat. No. 6,495,870.

BACKGROUND OF THE INVENTION

1. Field of the Invention

The present invention relates to an optical lithographic technology for forming microstructured patterns, more particularly to a method for exposing a light thereby to manufacture semiconductor devices.

2. Description of Related Art

In order to integrate semiconductor memories and microprocessors and speed up their operations more significantly, it will be unavoidable that the structure of the ULSI used for each of those devices must be formed precisely more and more. The most important item for such microstructure of an ULSI is micro-structuring of the optical lithography. At present, the lithography technique can form patterns in a size just under the light wavelength of the object lithography apparatus. For example, in the case of a 1 GB DRAM, a lithography apparatus that uses a light source of KrF excimer laser whose wavelength is 0.248 m must form word and data lines at a width of 0.16 m respectively.

In order to form a pattern in a size under the wavelength such way, super-resolution techniques such as phase shifting, off-axis illumination, etc. are used. The super-resolution technique is effective for forming and space (L&S) patterns in which simple lines such as word and data lines are formed in a memory repetitively. This is because the phase of a light passing adjacent line patterns is shifted by 180°, thereby the diffracted lights kill each other at each boundary between line patterns and a space pattern is formed there respectively. In the case of such super-resolution technique, the coherent factor is set to about 0.3, which is smaller than usual, thereby to increase mutual light interferences.

L&S patterns can be formed in a size under the wavelength using the above method. However, it is found that the method is confronted with problems when forming a pattern off the lines and spaces (L&S), for example, when forming connecting portions between a memory array and a peripheral circuit. This is because the light is diffracted at ends and corners of interconnects and the diffracted lights interfere each other, thereby a resist pattern becomes thinner than the master pattern there. And in the worst case, break failures occur in those interconnects. Hereunder, description will be made for new facts found by the present inventor, etc. through investigation with respect to the above problems.

FIG. 14 shows an explanatory view of such a new discovery. FIG. 14($a$) shows a conventional masking pattern for the word lines (WL) at a boundary between a memory array and a sub-word driver (SWD) or a word shunting area of a DRAM. In the sub-word driver (SWD), each word line is expanded to form a dog bone pattern so as to secure a space for placing a contact thereon. In this example, a sub-word driver (SWD) and a memory array are disposed alternately as to be described later in detail. The word lines WL0, 3, 4, and 7 are connected to the left side sub-word driver (SWD) and the word lines WL1, 2, 5, and 6 are connected to the right side sub-word driver (SWD).

FIG. 14($b$) shows a concept chart of a resist pattern obtained through a lithographic treatment performed for the pattern shown in FIG. 14($a$) using a lithography apparatus on the following conditions of the light source; KrF excimer laser of a wavelength of $\lambda$=0.248 μm, numerical aperture of the lens NA=0.6, coherent factor $\sigma$=0.3, and reduction rate K=⅕. And, short failures have occurred between the ends of adjacent word lines (WL) and break failures have occurred around dog-bone portions. Those failures are caused by bad influences of light interferences.

Hereunder, this phenomenon will be described concretely through an optical simulation. In this simulation, contour lines of the light intensities obtained on a resist film are computed on the basis of the master pattern and the optical constants of the lithography apparatus. FIG. 15($a$) shows a conventional masking pattern for the tips of word lines. The width and space of each word line are set to 0.16 μm. The optical constants are $\lambda$=0.248 μm, NA=0.6, $\sigma$=0.3, defocusing=−0.5 μm, and a spherical aberration is assumed. A phase-shift lithographic technique is used in this simulation. A 0°-phase is assigned to each pattern shown with right-up oblique lines and a 180°-phase is assigned to each pattern shown with right-down oblique lines. Principally, similar results can also be obtained with the off-axis illumination lithography technique. In all the subsequent simulations, the same optical conditions are assumed. A reduction projector is used for exposure in the optical lithography. In the case of light exposure at a reduction rate of K(K<1), the actual circuit pattern and the resist pattern are expanded by K times the masking pattern respectively. For example, at K=⅕, the line width of the masking pattern is 0.8 μm so as to obtain an interconnect width of 0.16 μm, but the masking pattern is reduced to the same size as those of the circuit pattern and the resist pattern for simplification thereafter. FIG. 14($b$) shows the distribution of light intensities, obtained as an optical image through computation from this pattern. In other words, FIG. 14($b$) shows the contour lines of the relative light intensities of 0.18, 0.32, and 0.53 respectively. The light intensity is defined as 1 for the light transmittance in an enough large pattern. The same three contour lines are indicated in all the subsequent optical simulation results.

FIG. 15($b$) shows a resist pattern that can obtain a contour line actually from a light intensity of 0.32. Word lines are formed at equal pitches at places away enough from the ends of the resist pattern. However, the contour line for a light intensity of 0.18 (the outermost line in the pattern) is not separated from adjacent word lines at the tips of the lines. This indicates that the light intensity is not lowered enough at this portion due to the effect of the light interference. Consequently, the resist remains after the development, thereby causing short failures to occur between word lines at a rather high possibility.

In such a dog-bone portion, the contour line of the light intensity of 0.53 breaks. This is because the light intensity in that portion is low. Consequently, the resist will be thinned and there is a high probability that break failures will occur there in the development process.

FIG. 16($a$) shows a conventional masking pattern for the tips of the second word lines. In this example, the sub-word driver (SWD) or shunting area is disposed at the left side of each corresponding memory array and all the word lines are connected to their left side sub-word driver (SWD). Even in this case, the contour line of the 0.18 light intensity (the outermost contour line in the pattern) is not separated from adjacent word lines, so there is a high probability that short failures will occur between those word lines.

Under such circumstances, it is an object of the present invention to prevent short and break failures from occurrence at the tip of each L&S pattern, etc.

SUMMARY OF THE INVENTION

In order to achieve the above object, the semiconductor of the present invention, when many word and data lines are laid out at equal pitches in an object memory, allows tips of adjacent lines to be terminated differently in length in the lengthwise direction. With such a disposition of adjacent lines, it is possible to weaken the effect of diffracted light interferences to occur at the tip of each line when in wiring of a pattern, thereby preventing short and break failures.

Such wiring is possible with exposure using a masking pattern in which adjacent patterns are terminated differently in length in the lengthwise direction. For example, in the masking patterns shown in FIG. 11(a), the tips of the adjacent patterns are shifted from each other in the lengthwise direction. If these masking patterns are used for exposure, the distribution of light intensities will become as shown in FIG. 11(b). It would be understood from FIG. 11(b) that there is little possibility that break and short failures occur, since they are separated properly in the pattern.

The difference of length between adjacent wirings at their tips should be over ½ of the wiring pitch. With this difference of length, short and break failures can be prevented more effectively. In addition, the difference of length between those adjacent wirings at their tips should be under the wiring pitch. With this difference of length, the redundant chip area can be minimized.

If the present invention applies to the word and data lines of DRAM, SRAM, flash memories, and mask ROM, it will be able to effectively prevent short and break failures in manufacturing processes.

Furthermore, according to the present invention, an exposure process is performed using masking line patterns provided with a side that is not in parallel to the short and long sides of each of those patterns respectively. The masking patterns are formed so that a corner of each line pattern is cut and the pattern is tapered toward the terminal portion. Consequently, the effect of diffracted light interferences can further be reduced. For example, in the case of the masking patterns shown in FIG. 10(a), the adjacent line patterns are terminated differently in length so as to be shifted from each other at their tips in the lengthwise direction and a corner of each line pattern is cut. If such masking patterns are used for an exposure process, the distribution of light intensities becomes as shown in FIG. 10(b), preventing break and short failures. It is thus possible to significantly reduce the possibility that break and short failures occur by using such corner-cut masking patterns. Although FIG. 10 shows masking patterns that are terminated differently in length so as to be shifted from each other at their tips in the lengthwise direction, the effect of diffracted light interferences can also be reduced to a certain extent, and accordingly short and break failures can be reduced even when the patterns are terminated at the same length if a corner of each line pattern is cut such way.

If the exposure light wavelength of the lithography apparatus is assumed to be $\lambda$ and the numerical aperture is to be NA, especially when the wiring pitch is less than $\lambda/(NA)$, then short and break failures will occur at tips of wirings. The above masking patterns will thus be effective to eliminate such failures.

The present invention can prevent such short and break failures if it applies to (1) word line patterns at a boundary between a memory array and a word-line driver, (2) word-line patterns at a boundary between a memory array and a word-line shunting area, and (3) data line patterns at a boundary between a memory array and a sense amplifier. In addition, the present invention can also apply effectively to the tip of the gate of each MOS transistor in a gate array.

Using the asymmetrical word lines of the present invention will thus be able to reduce the possibility that short failures will occur between those adjacent word lines at the boundary between a sub-word driver and a memory array, as well as between a shunting area of the word lines and a memory array. In addition, it will also reduce the possibility that break failures will occur at dog-bone patterns with which those word lines comes in contact when word lines are formed more precisely at a line width under the size of the light wavelength of the object lithography apparatus using an optical lithographic technique.

In the same way, using the asymmetrical data lines of the present invention will be able to reduce the possibility that short failures will occur between those adjacent data lines at the boundary between a sense amplifier and a memory array, as well as the possibility that break failures will occur at dog-bone patterns with which those data lines comes in contact when data lines are formed more precisely at a line width under the size of the light wavelength of the object lithography apparatus using an optical lithographic technique.

DESCRIPTION OF THE PREFERRED EMBODIMENTS

First Embodiment

Figure 1A:
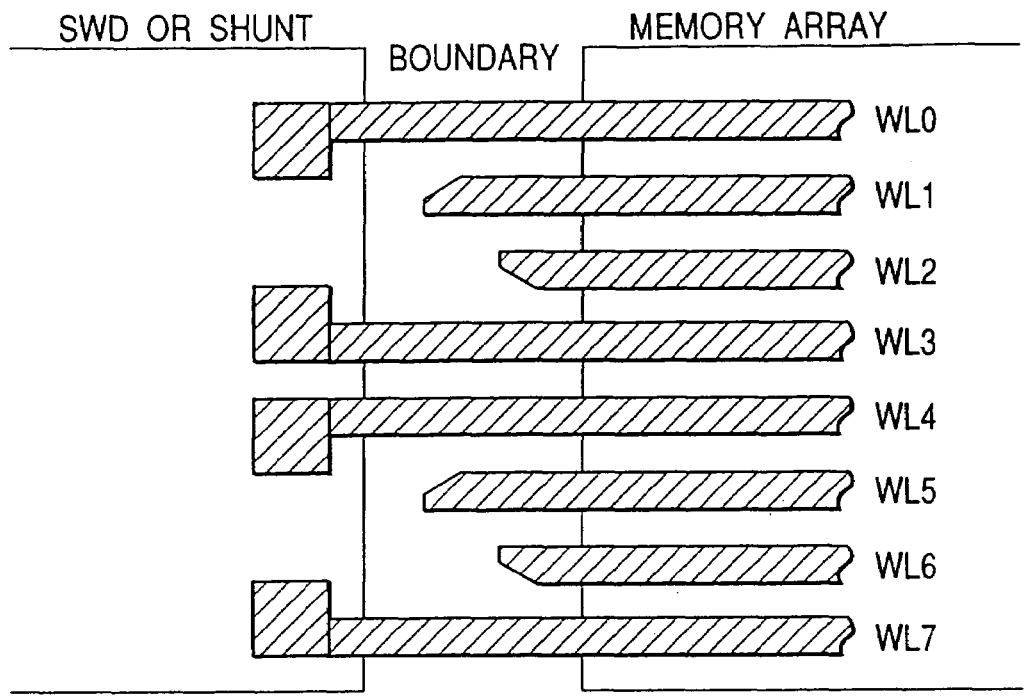
FIG. 1 shows the first asymmetrical word lines of the present invention.
Figure 1B:
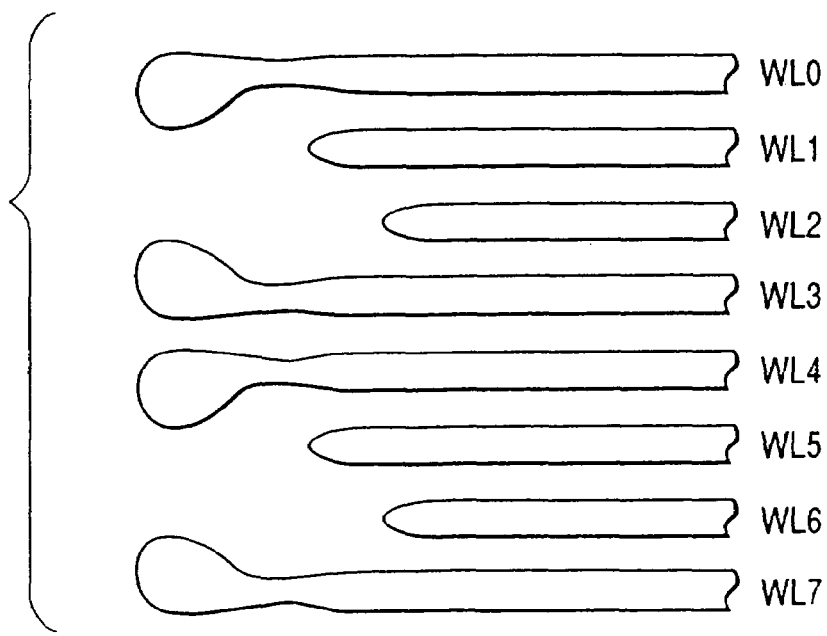

FIG. 1 shows the first asymmetrical word lines of the present invention. Adjacent word lines (WL1 and WL2, WL5 and WL6) are terminated differently in length at a boundary between a sub-word driver (SWD) and a memory array so that their tips are shifted from each other in a widthwise view. In addition, the tip of each word line is cut obliquely. FIG. 1(*b*) shows a conceptual view of a resist pattern obtained by exposing this pattern. The light is diffracted at the corners of the tip of each word line. In the case of the conventional line patterns, such diffracted lights interfere each other, causing short and break failures. On the other hand, if the masking line patterns of the present invention are used, the tips of adjacent word lines are terminated differently in length so as to be shifted from each other at their tips, thereby to weaken the mutual interferences of the diffracted lights. It is thus possible to prevent short failures from occurrence between the tips of those word lines, as well as break failures to occur on those word lines (e.g., WL0, 3, 4, and 7) at a boundary between a sub-word driver (SWD)/shunting area and a memory array. And, if it is assumed that the light wavelength of the lithography apparatus is $\lambda$, the numerical aperture is NA, and the difference of length between WL1 and WL2, as well as between WL5 and WL6 is set over $\lambda/(2\,NA)$, then the above short and break failures will be prevented more effectively. This is because the diffracted lights generated at the corners of the tip of each word line affect each other only within about $\lambda/(2\,NA)$. When only this pattern is watched, if the word line pitch is assumed to be P and the tips of adjacent word lines (e.g., WL1 and WL2, as well as WL5 and WL6) are shifted from each other by over P/2, then the above short and break failures will further be prevented effectively. This is because $\lambda$ and NA are decided so that P/2 and $\lambda/(2\,NA)$ become almost equal in the lithographic process. However, if the tips of those word lines are shifted excessively, the object chip area must be increased. To avoid such a problem, therefore, the shifting value should be within $\lambda/NA$ or within P.

In addition, when the tip is cut obliquely, if a vertical side is slightly left at the tip of each word line (WL) as shown in FIG. 1(*a*) so as not to sharpen the tip, the patterning treatment will become much easier for creating the mask data. If the hierarchical word method is not used for shunting word lines with metallic lines, the above patterns can also be used at the boundary between a shunting area of word lines and a memory array.

Figure 2A:
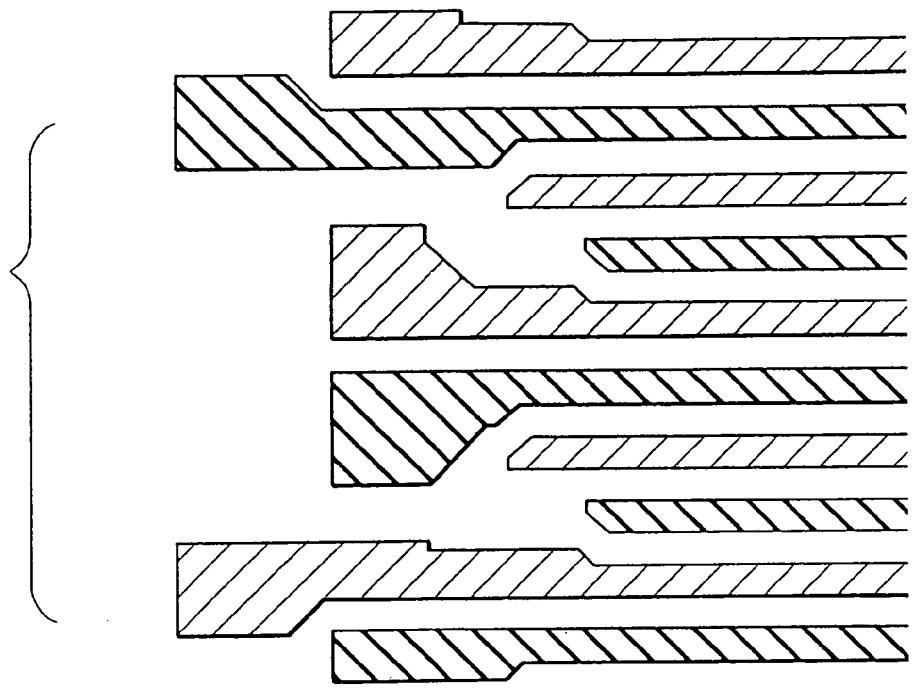
FIG. 2 shows optical simulation results of the first asymmetrical word lines of the present invention.
Figure 2B:
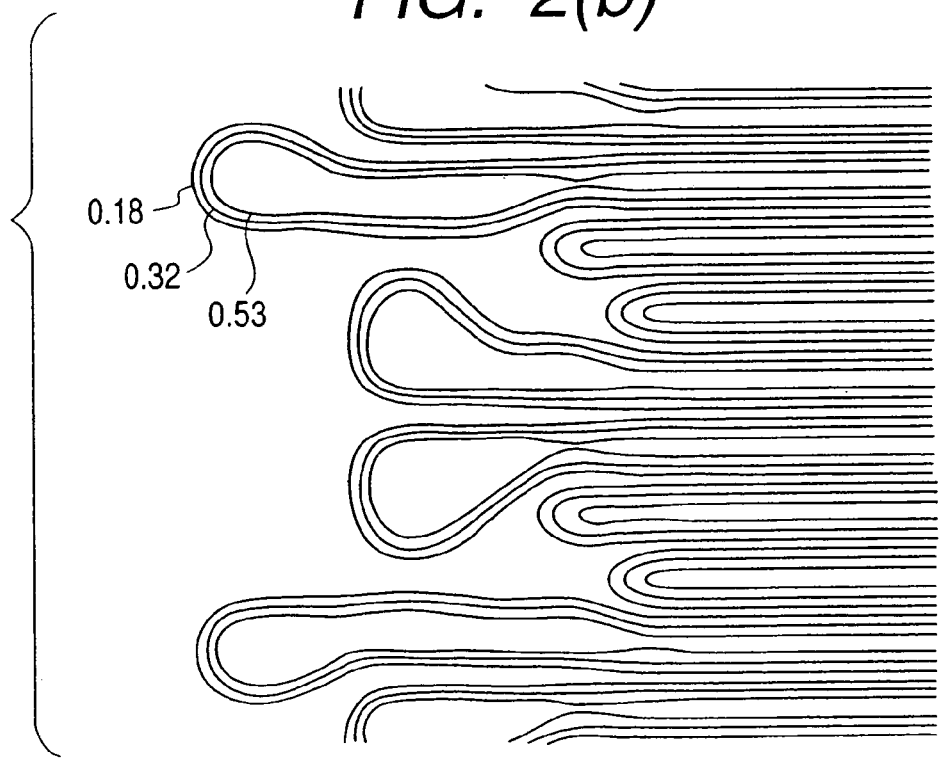

FIG. 2 shows the effect of the above patterns of the present invention, which is recognized through optical simulation. FIG. 2(*a*) shows masking patterns of the first asymmetrical word lines of the present invention. In this simulation, both of the width and space of each word line are set to 0.16 μm and the optical constants are $\lambda=0.248$ μm, NA=0.6, $\sigma=0.3$, and defocusing=−0.5 μm. Spherical aberration is also assumed. The phase shift lithography technique is used in this simulation. A 0°-phase is assigned to each pattern shown with right-up oblique lines and a 180°-phase is assigned to each pattern shown with right-down oblique lines. Principally, similar effects can also be obtained with the off-axis illumination method. In the subsequent simulations, the same optical conditions are also assumed. In order to simplify the description, each masking pattern is reduced to the same size as that of the circuit pattern and the resist pattern. FIG. 2(*b*) shows an optical image obtained through the computation of these patterns. In FIG. 2(*b*), contour lines are shown for the relative light intensities of 0.18, 0.32, and 0.53. The light intensity is defined as 1 for the light transmittance of an enough large pattern. The same three contour lines are also shown in each of the subsequent optical simulation results.

Using these patterns will be able to separate the contour line of the 0.18 light intensity (the outermost contour line in the pattern) from adjacent word lines, although short failures have occurred there conventionally. This indicates that the patterns are improved, thereby weakening the mutual interferences of diffused lights and accordingly, the possibility that short failures occur between adjacent word lines is much reduced. In addition, the contour line of the 0.53 light intensity is formed continuously at each dog-bone portion, although break failures have occurred there conventionally, and the light intensity is prevented from falling at the portion. Consequently, the possibility that break failures will occur in the development process is also much lowered.

Second Embodiment

In this embodiment, the present invention is applied to a DRAM.

Figure 3:
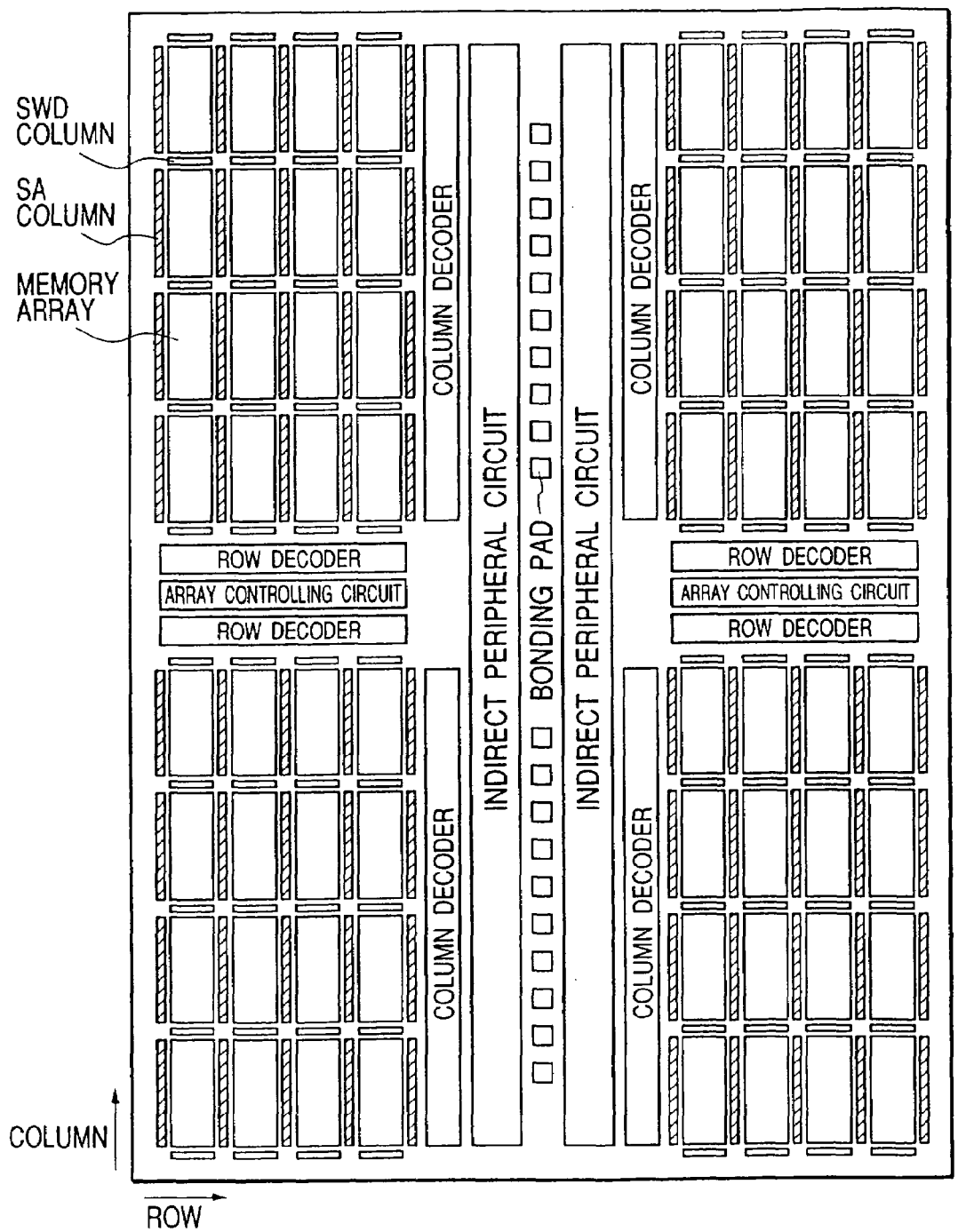
FIG. 3 shows a block diagram of a DRAM chip.

In a DRAM, the patterns as shown in FIG. 1 appear not only at word lines, but also at data lines. FIG. 3 shows a block diagram of a DRAM chip. In the center of the chip are disposed a bonding pad and indirect peripheral circuits side by side in the lengthwise direction. In this central portion are also disposed address and data I/O circuits, a power supply circuit, a refreshment controlling circuit, a main amplifier, etc. In the widthwise direction are disposed array controlling circuits used for controlling sub-word drivers (SWD) and sense amplifiers (SA). The chip is divided roughly into four blocks according to the above circuits. Each of those blocks is enclosed by row decoders for outputting signals of the main word lines (MWLB) respectively and column decoders for outputting signals of the selected column lines (YS) respectively. Each block is divided by sense amplifier arrays in the row-wise direction and by sub-word driver arrays in the column-wise direction. A memory array is a collection of memory cells disposed in arrays and each of the memory cells is enclosed by a sense amplifier array and a sub-word driver array.

Figure 4:
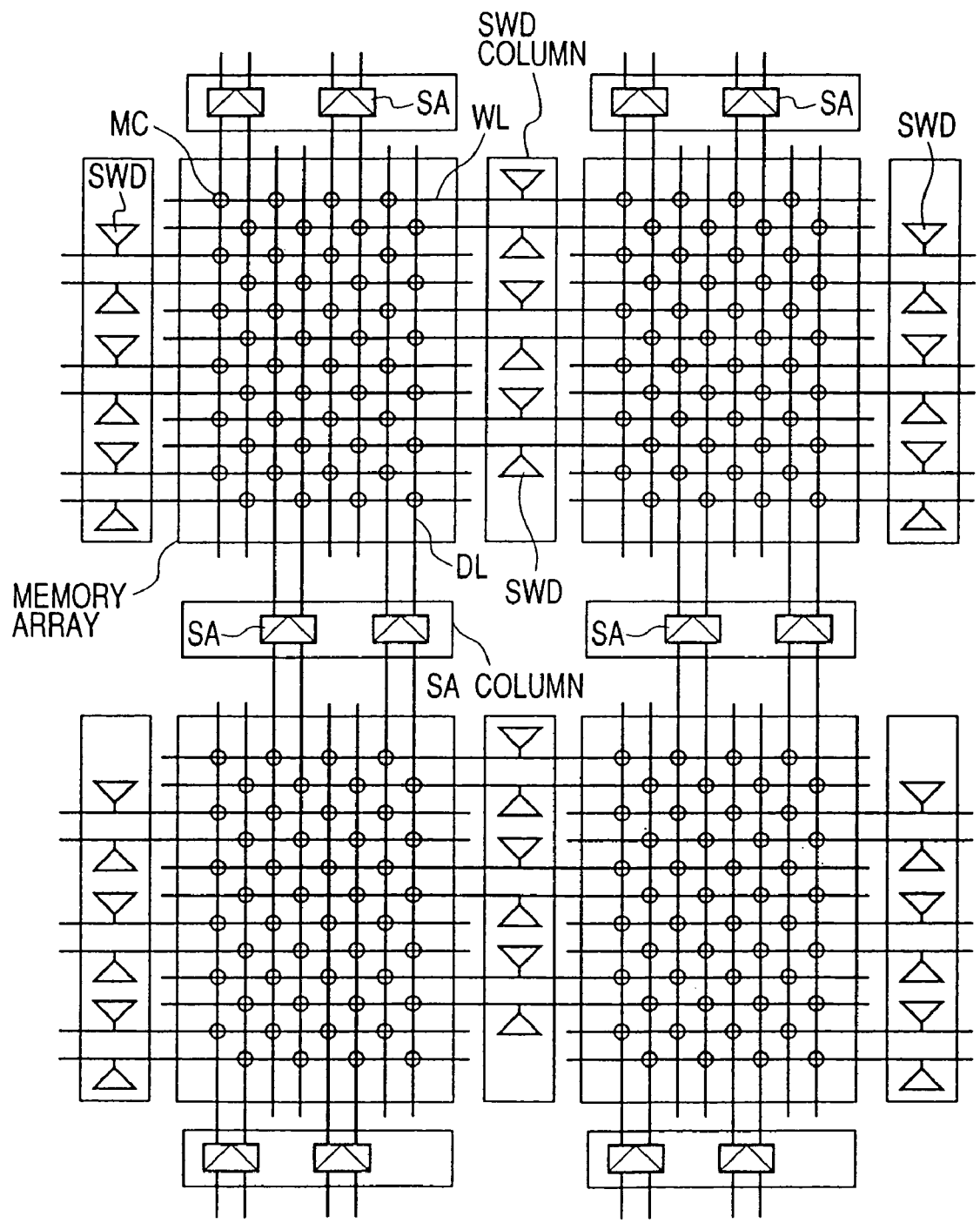
FIG. 4 shows a block diagram of memory arrays laid out by the alternate placement hierarchical WD method.

FIG. 4 shows a block diagram including sub-word driver arrays, sense amplifier arrays, and memory cell arrays laid out by the alternate placement hierarchical word driver (WD) method. A memory cell (MC) is disposed at each intersection point of word lines (WL) and data lines (DL). Each word line (WL) is driven by a sub-word driver (SWD). Data from two data lines (DL) is entered to a sense amplifier (SA), so that signals from memory cells are amplified. A sub-word driver (SWD) and a sense amplifier (SA) are disposed alternately for a memory array. More concretely, word lines (WL) are connected to the right and left sub-word drivers alternately in units of two lines. Data lines are also connected to the upper and lower sense amplifiers (SA) in units of two lines.

Figure 5:
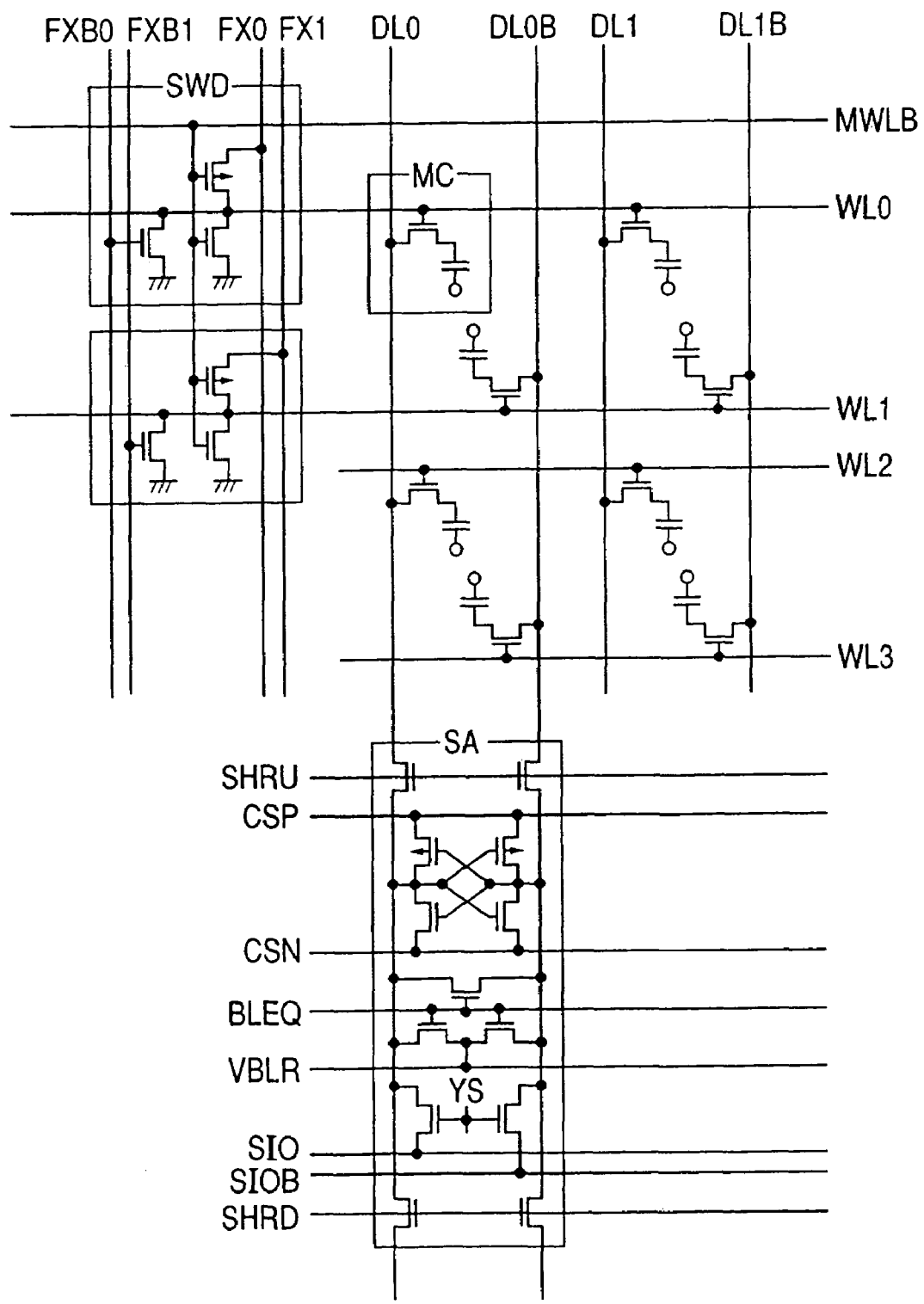
FIG. 5 is a circuit diagram of a memory array laid out by the alternate placement hierarchical WD method.

FIG. 5 shows circuit diagrams of a sub-word driver, a sense amplifier, and a memory cell. The operation of each of those components will be as follows. When the DRAM is in the stand-by state, every main word line (MWLB) is set to Vpp (a voltage higher than the high level VDL of data lines) and every sub-word driver select line (FX) is set to Vss (ground potential). The sub-word driver (SWD) outputs the Vss to the word lines (WL). In a memory cell (MC), a selected transistor is turned off and the voltage of VDL or Vss is written in the capacitor according to the information. In each sense amplifier (SA), both SHRU and SHRD are set to Vpp, both CSP and CSN are set to VBLR, the BLEQ is set to Vcc (a voltage higher than VDL and lower than Vpp), and the YS is set to Vss. The data lines are precharged to VBLR respectively. Usually, VBLR=VDL/2 is assumed.

If a command and an address are entered to the DRAM and the above memory array is selected, the voltages of both SHRD and BLEQ are lowered to Vss at first. Then, one MWLB is set to Vss and one FX is set to Vpp. A word line selected in the sub-word driver is thus activated. After this, the selected transistor of the memory cell connected to the activated word line is turned on, thereby a signal is output to the object DL or DLB. Then, the CSP voltage is heightened to VDL and the CSN voltage is lowered to Vss respectively. The signal is then amplified in the sense amplifier. When in a read operation, the potential difference between a pair of data lines (DL) is increased enough, the YS voltage is raised to Vcc, so that data is read to both SIO and SIOB. On the contrary, when in a write operation, data is written from both SIO and SIOB.

FIG. 6 shows a layout of both word lines and data lines of the present invention at the boundary between a sense amplifier and a memory array provided with memory cells. M1 indicates the first metallic wiring layer and ACT indicates a MOS transistor active area. CONT indicates a contact for connecting M1 to WL or ACT. SNCT indicates a contact for connecting the capacitor of an MC to a selected transistor. DCLT indicates a contact for connecting a selected memory cell transistor to a data line.

Figure 6A:
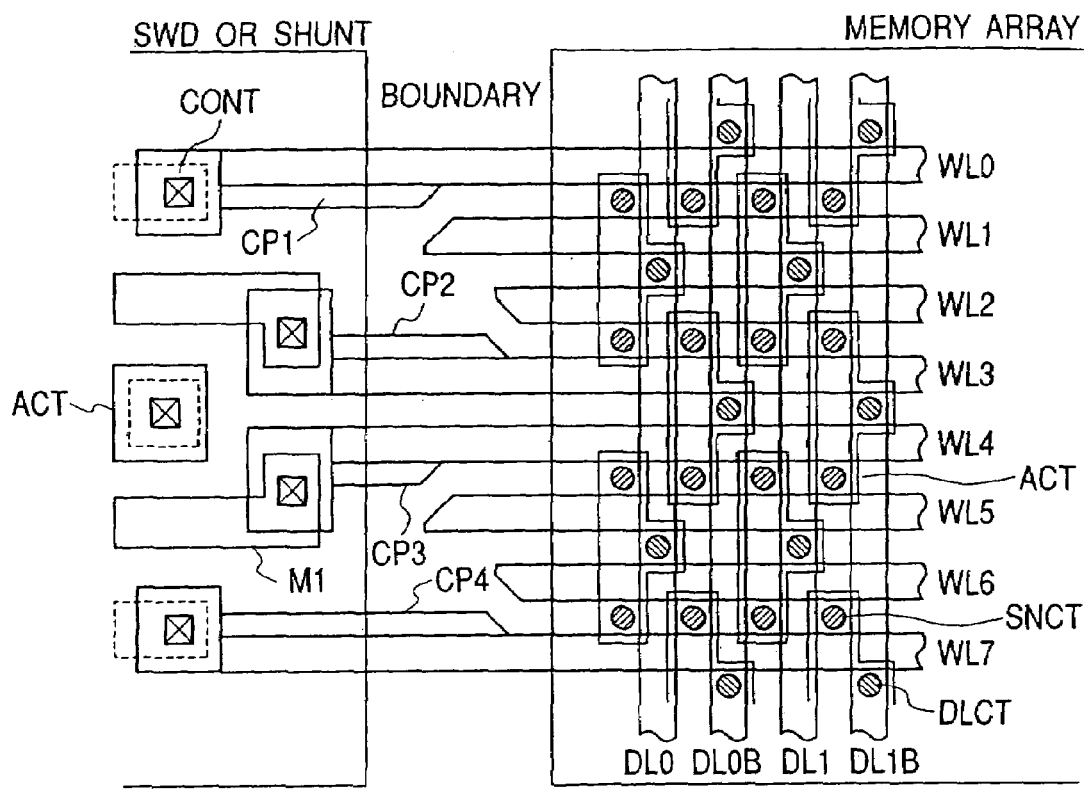
FIG. 6 shows asymmetrical word lines and data lines of the present invention.

FIG. 6(a) shows the boundary between a sub-word driver (SWD) and a memory array. A sub-word driver (SWD) and a memory array are disposed alternately. At the boundary between a sub-word driver (SWD) and a memory array, some word lines (e.g., WL0, 3, 4, and 7) pass the boundary and enters their sub-word driver and others (e.g., WL1, 2, 5, and 6) are terminated at the boundary, alternately in units of two lines. Just like in FIG. 1, the word lines WL2 and WL2, as well as WL5 and WL6 are terminated differently in length so as to be shifted from each other at their tips. In addition, the tip of each word line (WL) is cut obliquely. Using such masking patterns will thus prevent short failures to occur between the tips of adjacent word lines, as well as break failures to occur on those word lines (WL0, 3, 4, and 7) at the boundary. If the difference of length between WL1 and WL2, as well as between WL5 and WL6 is set over $\lambda/(2\,NA)$ respectively, the above effect will be more improved. When only the pattern is watched, if the word line pitch is assumed to be P and adjacent word lines (e.g., WL1 and WL2, as well as WL5 and WL6) are terminated differently in length so as to be shifted from each other at their tips by over P/2, the above effect will be much more improved. However, if the tips of those word lines are shifted from each other excessively, the chip area must be increased. To avoid such a problem, therefore, the shifting value should be within $\lambda/NA$ or within P.

In addition, when the tip is cut obliquely, if a vertical side is slightly left at the tip of each word line (WL) as shown in FIG. 6(a) so as not to sharpen the tip, the patterning treatment will become much easier for creating the mask data. If the hierarchical word method is not used for shunting word lines with metallic lines, the above pattern can also be used at the boundary between a shunting area of those word lines and a memory array.

In addition, in this pattern, an additive pattern (CP1-4) is added to each dog-bone portion on which a contact is formed for each of the word lines (WL0, 3, 4, and 7). With such an added pattern, break failures will be prevented more effectively on each of the word lines (WL0. 3, 4, and 7) at the boundary. The additive pattern will be able to more effectively prevent break failures when its size in the data line direction is over $\lambda/(10\,NA)$ to $\lambda/(2\,NA)$ (included) and its size in the word line direction is over $\lambda/(2\,NA)$. If the size of the additive pattern in the data line direction is small excessively, it becomes difficult to check masking patterns. If the size is larger than $\lambda/(2\,NA)$, however, the additive pattern itself is resolved. To avoid this, therefore, the size should be set within the above proper range. As for the size of the additive pattern in the word line direction, the effect of the additive pattern will appear when it is set over the resolution limit. When only the pattern is watched, the effect of the additive pattern will be improved more to prevent break failures if its size in the data line direction is over P/10 to P/2 (included) and its size in the word line direction is over P/2.

Figure 6B:
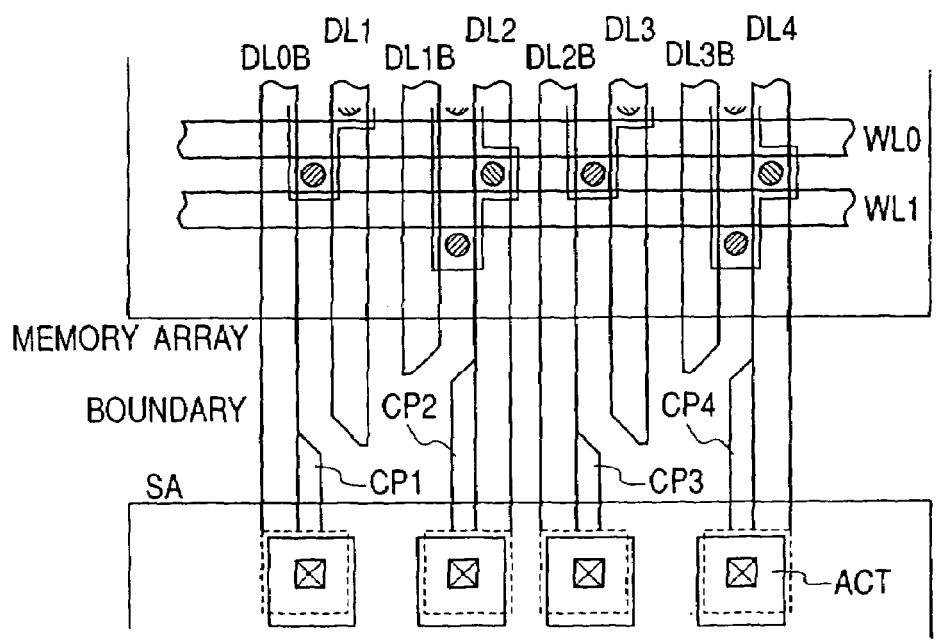

FIG. 6(b) shows the boundary between a sense amplifier (SA) and a memory array. A sense amplifier and a memory array are disposed alternately. Consequently, as seen at such a boundary between a sense amplifier and a memory array, some data lines (e.g., DL0B, 2, 2B, and 4) pass the boundary and enter their sense amplifier and others (e.g., DL1, 1B, 3, and 3B) are terminated at the boundary. The data lines repeat this alternately in units of two lines.

This time, the adjacent data lines DL1 and DL1B, as well as DL3 and DL3B are terminated differently in length respectively and the tip of each of those data lines is cut obliquely. Using such masking patterns will thus be able to prevent short failures to occur between the tips of data lines, as well as break failures to occur on those data lines (DL0B, 2, 2B, and 4) at the boundary. If the difference of length between DL1 and DL1B, as well as between DL3 and DL3B is set over $\lambda/(2\,NA)$, the above effect will be more improved. When only the pattern is watched, if the word line pitch is assumed to be PD and the tips of data lines (e.g., DL1 and DL1B, as well as DL3 and DL3B) are shifted from each other by over PD/2, then, the above effect will be much more improved. However, when the tips of those word lines are shifted from each other excessively, the chip area must be increased. To avoid such a problem, therefore, the shifting value should be within $\lambda/NA$ or within PD.

In addition, when the tip is cut obliquely, if a vertical side is slightly left at the tip of each data line (DL) as shown in FIG. 6(b) so as not to sharpen the tip, the patterning treatment will become much easier for creating the mask data.

In addition, in this pattern, an additive pattern (CP1-4) is added to each dog-bone portion for each of the data lines (DL0B, DL2, DL2B, and DL4), on which a contact is formed. With such an added pattern, break failures will be prevented more effectively on each of the word lines DL0B, DL2, DL2B, and DL4 at the boundary. The additive pattern can prevent break failures more effectively when its size in the word line direction is over $\lambda/(10\,NA)$ to $\lambda/(2\,NA)$ (included) and its size in the data line direction is over $\lambda/(2\,NA)$. When only the pattern is watched, the effect of such an additive pattern will be improved more to prevent break failures if its size in the word line direction is over PD/10 to PD/2 (included) and its size in the data line direction is over P/2.

On the other hand, if a pair of data lines (e.g., DL1 and DL1B) are terminated differently in length so as to be shifted from each other at their tips, the data line capacitance will be unbalanced between those lines, causing the sensitivity of the sense amplifier to be lowered. However, since the necessary difference of length between data lines in this present is very small with respect to the length of each data line, such unbalance can almost be neglected. For example, if memory cells of 512 bits per sense amplifier are connected at 0.32 µm data line pitches, the length of the data line becomes 163.84 µm. On the other hand, the necessary difference of length between adjacent data lines in the present invention is assumed to be $\lambda=0.248$ µm and NA=0.6 µm, then $\lambda/(2\,NA)=0.21$ µm is satisfied. The unbalance value will thus be 0.1% or so.

Third Embodiment

Figure 7A:
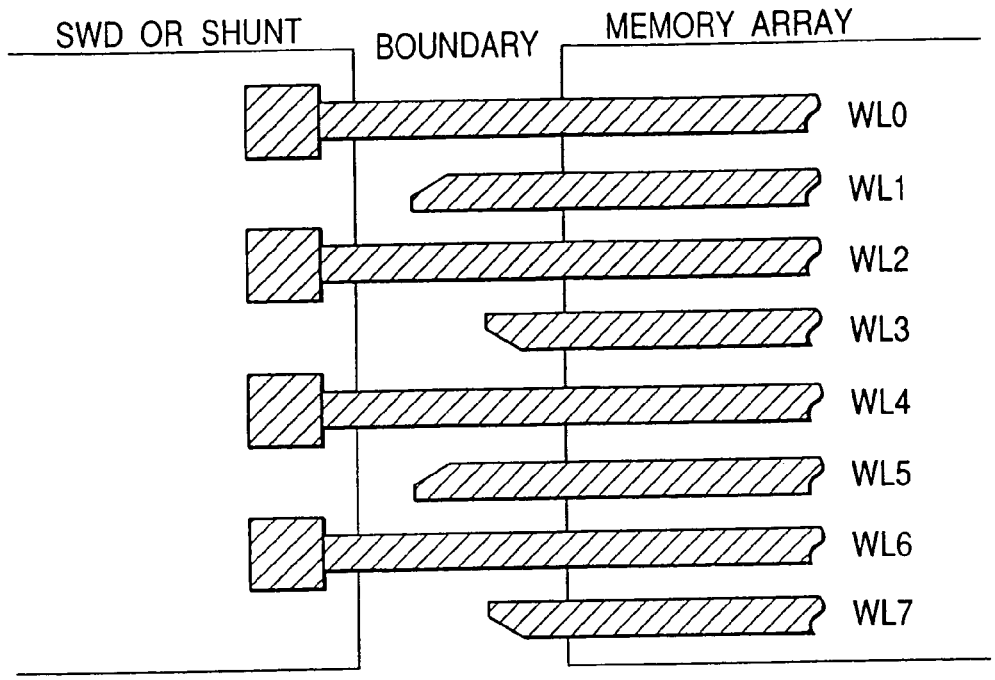
FIG. 7 shows the second and third asymmetrical word lines of the present invention.

FIG. 7(a) shows the second asymmetrical word lines of the present invention.

In FIG. 7(a), a sub-word driver and a memory array are disposed alternately. Word lines are connected to the right side sub-word driver and the left side sub-word driver alternately. Consequently, at the boundary between a sub-word driver and a memory array, some word lines (e.g., WL0, 2, 4, and 6) pass and enter their sub-word driver and others (WL1, 3, 5, and 7) are terminated at the boundary. The word lines repeat this alternately. If all the word lines are terminated at the same length just like in the conventional technique even for such patterns, short failures will occur between the tips of adjacent word lines, as well as break failures occur on tips of those word lines at the boundary due to the mutual interferences of diffracted lights.

In such patterns of the present invention, adjacent word lines terminated at the boundary are changed in length so as to be shifted from each other at their tips and the tip of each word line is cut obliquely. Using such masking line patterns will thus be able to prevent short failures to occur between the tips of word lines, as well as break failures to occur on the word lines (WL0, 2, 4, and 6) at the boundary. If the difference of length between adjacent word lines (e.g., WL1 and 3, as well as WL5 and 7) is set over $\lambda/(2\ NA)$, the above effect will be more improved. When only the pattern is watched, if the word line pitch is assumed to be P and adjacent word lines (e.g., WL1 and 3, as well as WL5 and 7) are terminated differently in length so as to be shifted from each other at their tips by over P/2, the above effect will be much more improved. However, when the tips of those word lines are shifted from each other excessively, the chip area must be increased. To avoid such a problem, therefore, the shifting value should be within $\lambda/NA$ or within P. When the tip is cut obliquely, if a vertical side is slightly left at the tip of each word line (WL) as shown in FIG. 7(a) so as not to sharpen the tip, the patterning treatment will become much easier for creating the mask data. If word lines are shunted with metallic lines respectively without using the hierarchical word method, the same pattern can also be used at the boundary between a word line shunting area and a memory array.

Fourth Embodiment

Figure 7B:
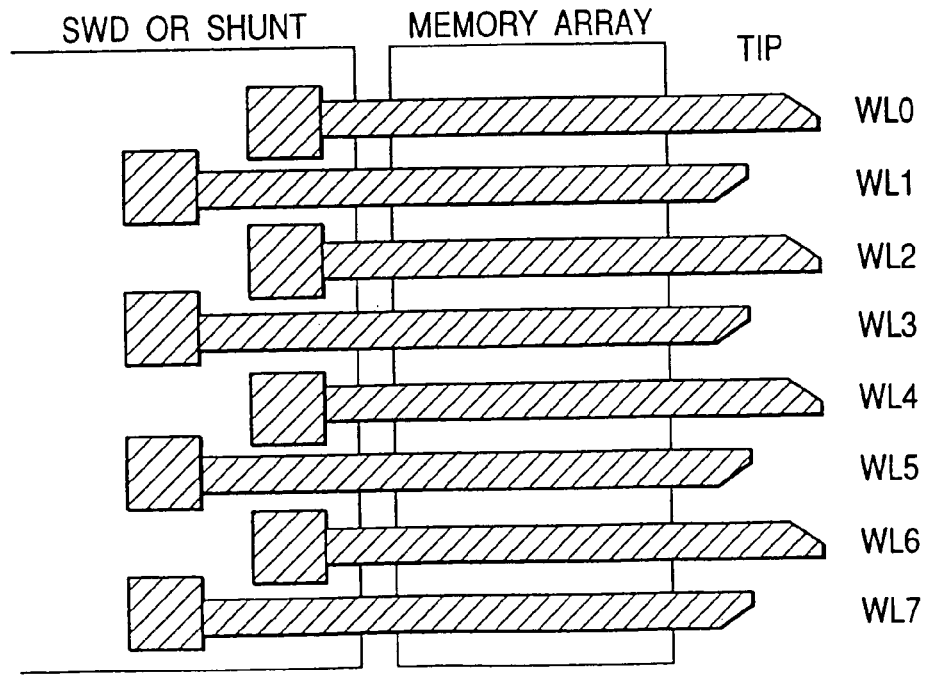
Figure 16A:
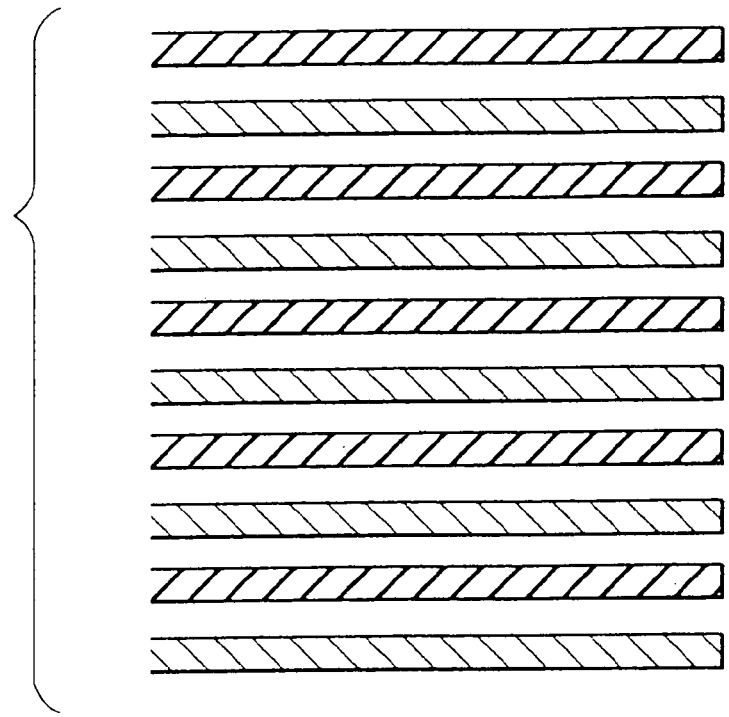
FIG. 16 shows optical simulation results of the conventional second word lines.
Figure 16B:
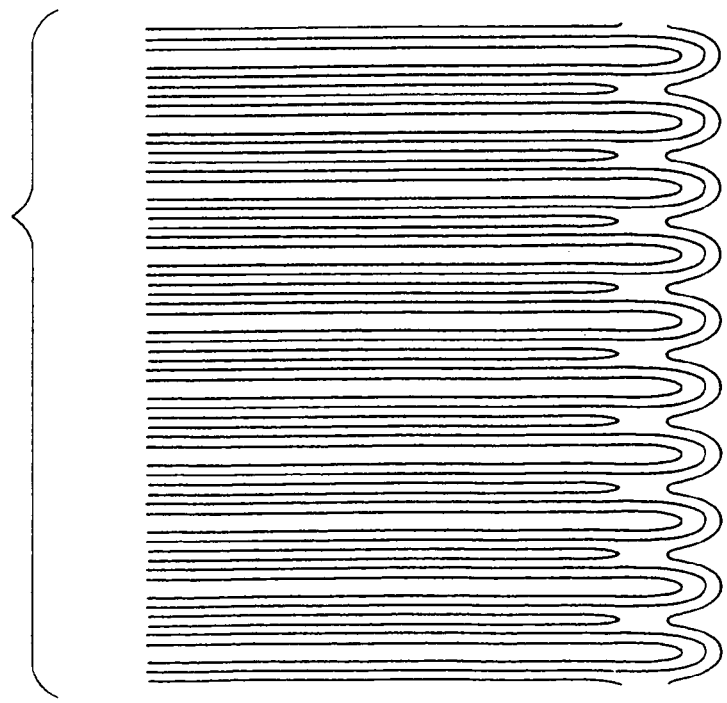

FIG. 7(b) shows the third asymmetrical word lines of the present invention. In FIG. 7(b), all the sub-word drivers are disposed on one side of each memory array and all the word lines are connected to the left side sub-word drivers. In this embodiment, all the word lines are terminated at the right side of each memory array. As shown in FIG. 16 (the tips of the conventional second word lines), since all the word lines are equal in length, short failures occur at the tips of all those word lines. In this present invention, however, adjacent word lines are terminated differently in length so as to be shifted from each other at their tips. In addition, the tip of each word line is cut obliquely. Using such masking patterns will thus be able to prevent short failures to occur between the tips of word lines. If the difference of length between those adjacent word lines (e.g., WL0 and 1, as well as WL2 and 3) is set over $\lambda/(2\ NA)$, the above effect will be more improved. When only the pattern is watched, if the word line pitch is assumed to be P and adjacent word lines (e.g., WL0 and 1, as well as WL2 and 3) are terminated differently in length so as to be shifted from each other at their tips by over P/2, the above effect will be much more improved. However, when the tips of those adjacent word lines are shifted from each other excessively, the chip area must be increased. To avoid such a problem, therefore, the shifting value should be within $\lambda/NA$ or within P. When the tip is cut obliquely, if a vertical side is slightly left at the tip of each word line (WL) as shown in FIG. 7(b) so as not to sharpen the tip, the patterning treatment will become much easier for creating the mask data. If word lines are shunted with metallic lines respectively without using the hierarchical word method, the same pattern can also be used at the boundary between a word line shunting area and a memory array.

Figure 8A:
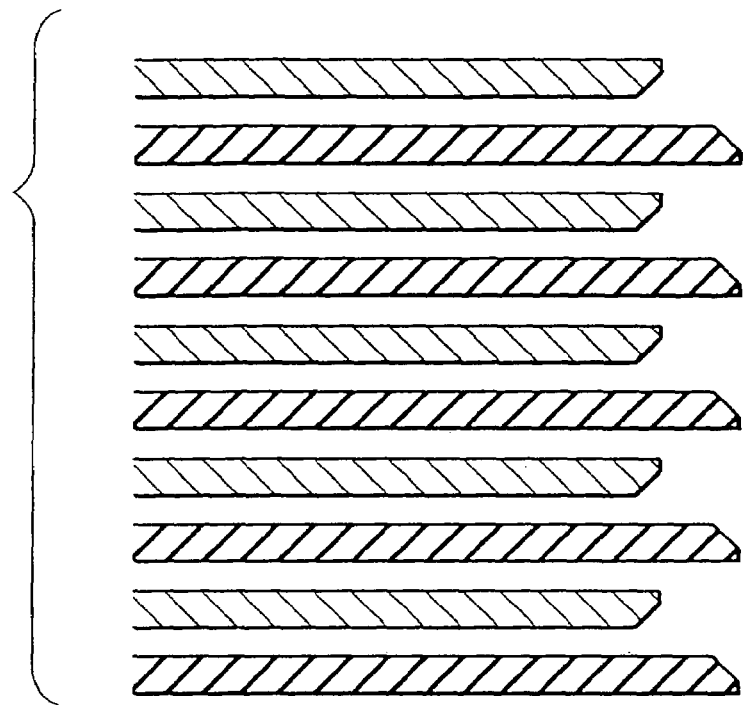
FIG. 8 shows optical simulation results of the third asymmetrical word lines of the present invention.

Hereunder, the effect of these patterns recognized through optical simulation will be described. FIG. 8(a) shows masking patterns of the third asymmetrical word lines of the present invention. Both width and space of each word line are set to 0.16 µm. As shown in FIG. 8(a), using these making patterns will be able to separate the contour line of the 0.18 light intensity (the outermost contour line in the pattern) from adjacent word lines, although the contour line has been shorted conventionally. Short failures still occur in a few portions, but it will be understood that such possibility that short failures will occur is much more reduced when compared with the conventional pattern shown in FIG. 16.

Fifth Embodiment

Figure 9A:
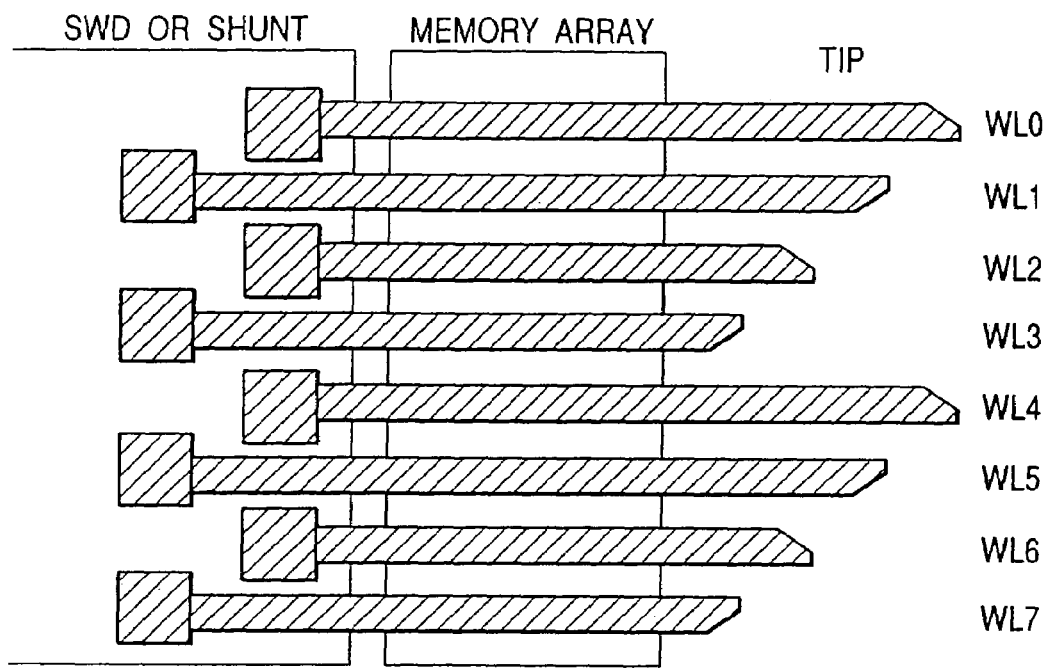
FIG. 9 shows the fourth and fifth asymmetrical word lines of the present invention.

FIG. 9(a) shows the fourth asymmetrical word lines of the present invention. Just like in FIG. 7(b), every sub-word driver (SWD) is disposed on one side of each memory array, so that all the word lines are connected to the left side sub-word drivers (SWD). In this pattern, every set of four word lines are terminated differently in length. The word lines become longer in ascending order (WL0, 1, 2, and 3) and the tip of each word line is cut obliquely. If such masking patterns are used, a surplus area is needed on the object chip more than when adjacent word lines are terminated differently in length. However, this pattern will be more effective to prevent short failures to occur between the tips of those adjacent word lines than when adjacent word lines are terminated differently in length. If the difference of length between those adjacent word lines (e.g., WL0 and 1, as well as WL2 and 3) is set over $\lambda/(2\ NA)$, the above effect will be more improved. When only the pattern is watched, if the word line pitch is assumed to be P and adjacent word lines (e.g., WL0 and 1, as well as WL2 and 3) are terminated differently in length so as to be shifted from each other at their tips by over P/2, the above effect will be much more improved. However, when the tips of those word lines are shifted from each other excessively, the chip area must be increased. To avoid such a problem, therefore, the shifting value should be within $\lambda/NA$ or within P. In this embodiment, since a set of four word lines are terminated differently in length from each another substantially, this embodiment is also effective for patterns in which any two word lines of WL0-4 are replaced. In addition, the number of word lines in such a set of word lines may be changed freely from two and four described above.

When the tip is cut obliquely, if a vertical side is slightly left at the tip of each word line (WL) as shown in FIG. 9(a) so as not to sharpen the tip, the patterning treatment will become much easier for creating the mask data. If word lines are shunted with metallic lines respectively without using the hierarchical layer word method, the same pattern can also be used at the boundary between a word line shunting area and a memory array.

Figure 8B:
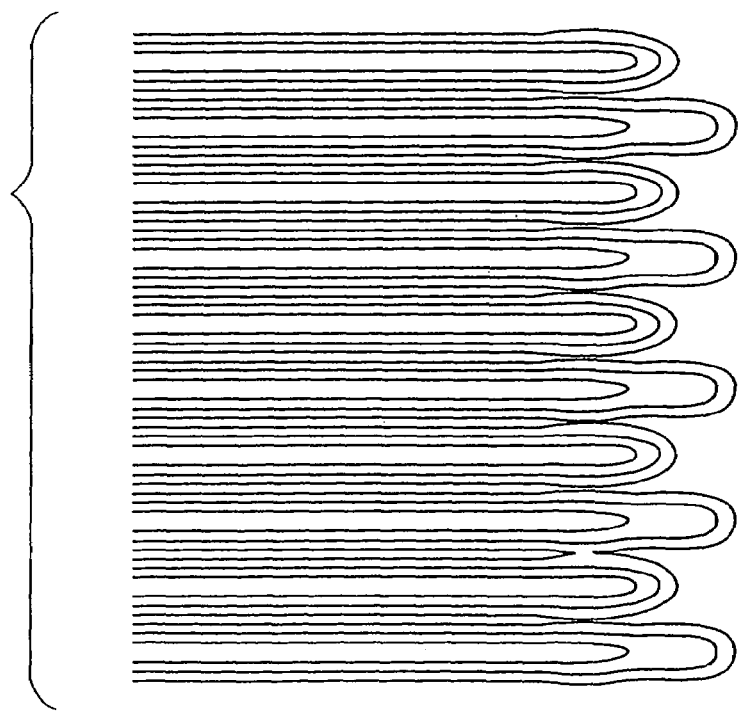
Figure 10A:
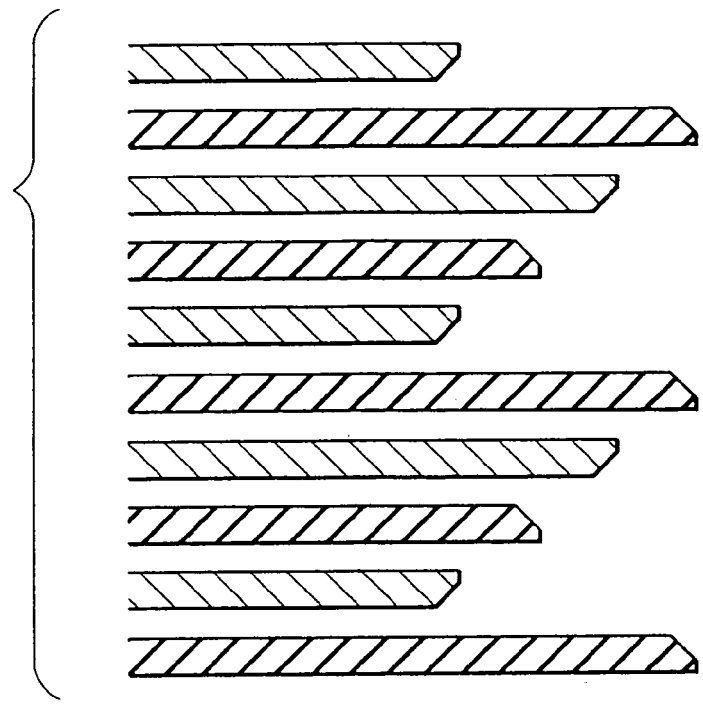
FIG. 10 shows optical simulation results of the fourth asymmetrical word lines of the present invention.
Figure 10B:
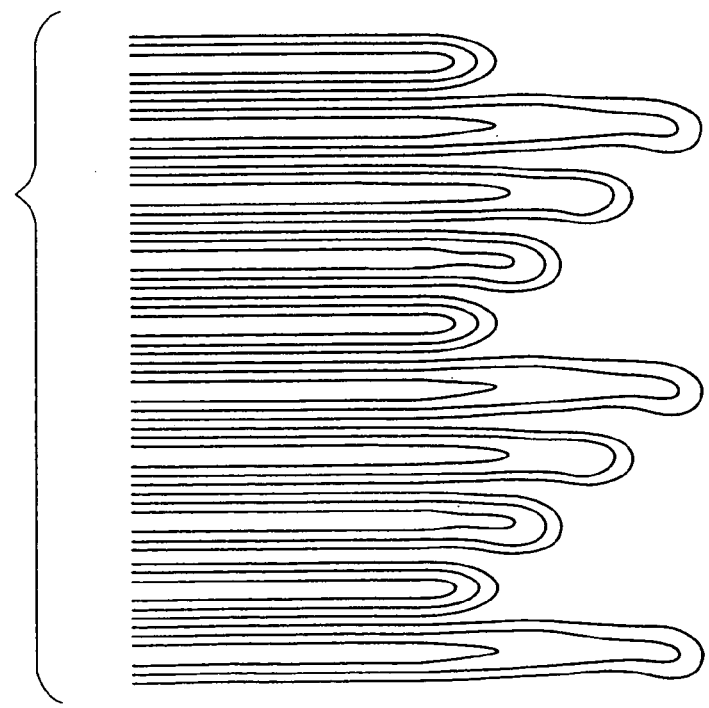

Hereunder, the effect of these patterns recognized through optical simulation will be described. FIG. 10(a) shows masking patterns of the fourth asymmetrical word lines of the present invention. Both width and space of each word line are set to 0.16 µm. As the distribution of light intensities is shown in FIG. 10(b), using these making patterns can successfully separate the contour line of the 0.18 light intensity (the outermost contour line in the pattern) from adjacent word lines, although the contour line has been shorted conventionally. It will thus be understood that the possibility that short failures will occur is much more reduced when compared with the conventional pattern shown in FIG. 16 and the pattern shown in FIG. 8(b).

Sixth Embodiment

Figure 9B:
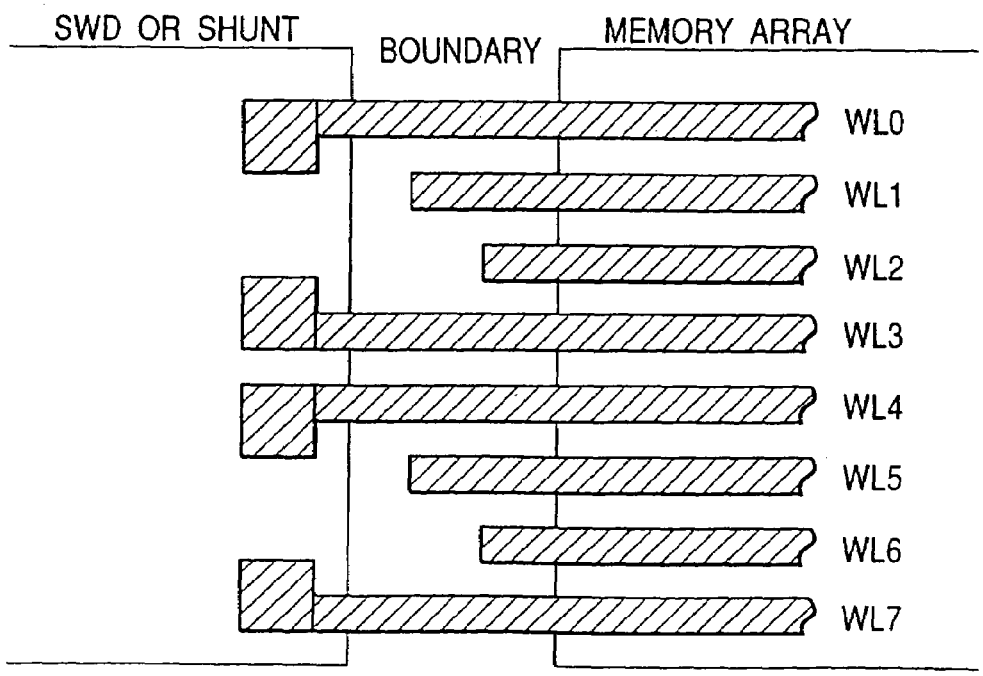
Figure 11A:
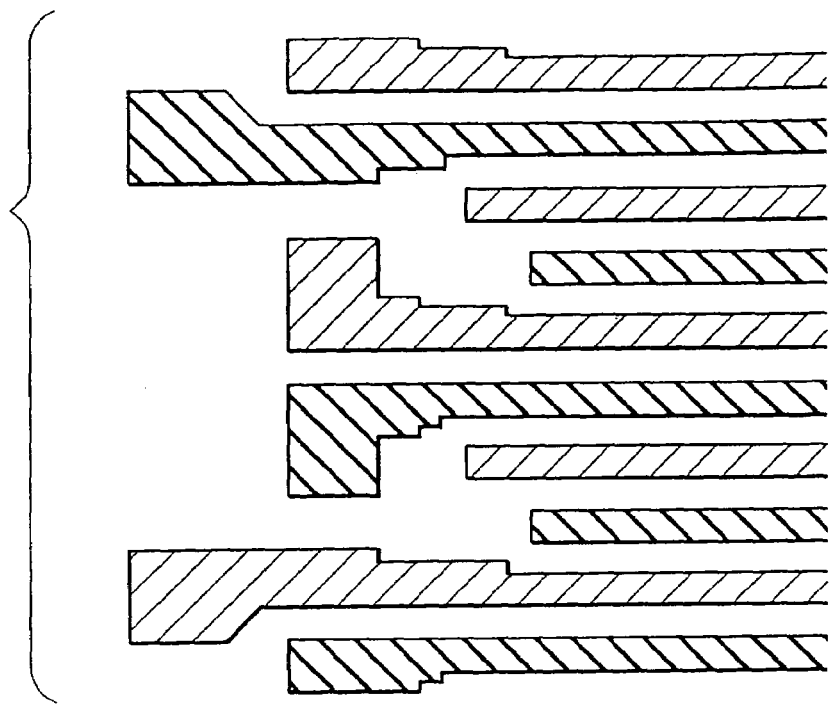
FIG. 11 shows optical simulation results of the fifth asymmetrical word lines of the present invention.
Figure 11B:
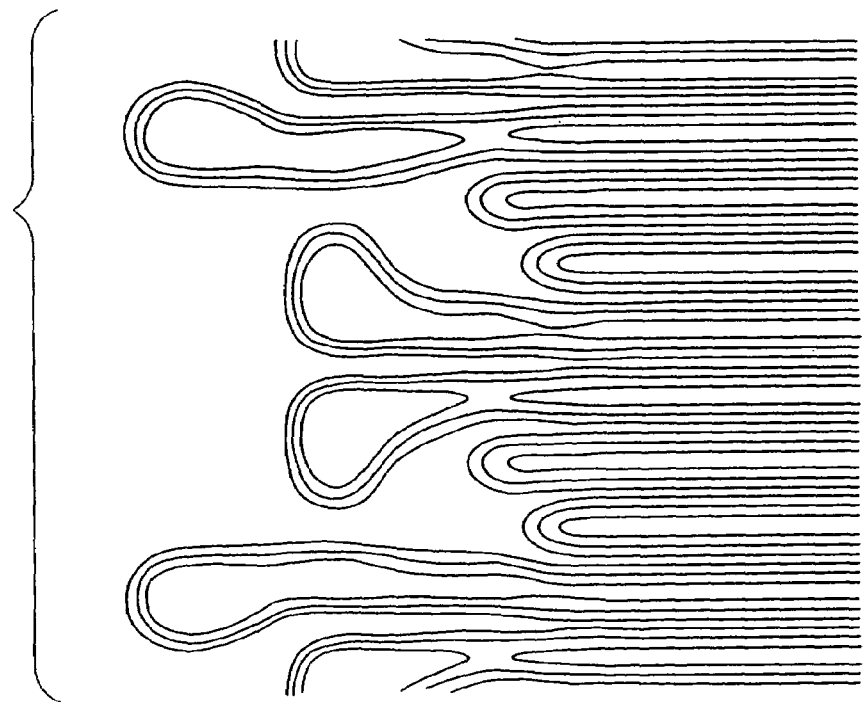

FIG. 9(b) shows the fifth asymmetrical word lines of the present invention. Length is changed between adjacent word lines (e.g., WL1 and WL2, WL5 and WL6) at the boundary between a sub-word driver and a memory array, so that their tips are shifted from each other in the horizontal direction. In this pattern, the tip of each word line is not cut obliquely. FIG. 11(a) shows masking patterns of the present invention and FIG. 11(b) shows a result of optical simulation for these patterns. When compared with an embodiment in which the tip of each word line is cut obliquely, short failures to occur between the tips of those adjacent word lines can be prevented more effectively, since the effect for suppressing mutual interferences of diffracted lights is small. Although break failures to occur at dog-bone portions are still left unsolved, this pattern is very effective to prevent short failures, for example, when each line is wider than the space, thereby no break failure occurs. If the light wavelength of the object lithography apparatus is assumed to be $\lambda$ and the numerical aperture to be NA, as well as if the difference of length between adjacent word lines (WL1 and 2, WL5 and 6) is over $\lambda/(2 NA)$, then the above effect will becomes more significant. When only the pattern is watched, if the word line pitch is assumed to be P and adjacent word lines (e.g., WL1 and 2, as well as WL5 and 6) are terminated differently in length so as to be shifted from each other at their tips by over P/2, the above effect will be much more improved. However, when the tips of those word lines are shifted from each other excessively, the chip area must be increased. To avoid such a problem, therefore, the shifting value should be within $\lambda/NA$ or within P. In this embodiment, since the tip of each word line is not cut obliquely and the number of peaks of pattern data is less, the patterning treatment will become much easier for creating the mask data. If word lines are shunted with metallic lines respectively without using the hierarchical word method, the same pattern can also be used at the boundary between a word line shunting area and a memory array.

Seventh Embodiment

Figure 12A:
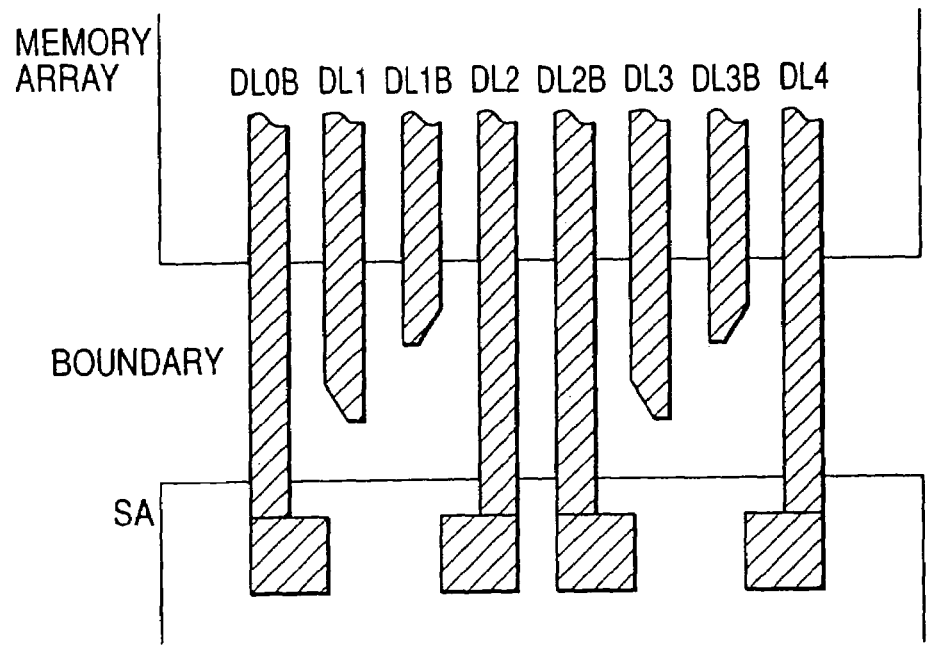
FIG. 12 shows the first asymmetrical data lines of the present invention.

FIG. 12(a) shows the first asymmetrical data lines of the present invention. A sense amplifier (SA) and a memory array are disposed alternately. Consequently, some data lines (e.g., DL0B, DL2, DL2B, and DL4) pass the boundary between a sense amplifier and a memory array and enter their sense amplifier and others (e.g., DL1, DL1B, DL3, and DL3B) are terminated at the boundary. The data lines repeat this alternately in units of two lines.

According to the present invention, length is changed between adjacent data lines (e.g., DL1 and DL1B, DL3 and DL3B) so that their tips are shifted from each other. In addition, the tip of each data line is cut obliquely. Using such masking line patterns effectively prevents short failures between the tips of those adjacent word lines, as well as break failures on the word lines (DL0B, DL2, DL2B, and DL4) terminated at the boundary. If the difference of length between adjacent word lines (e.g., DL1 and 1B, as well as DL3 and 3B) is set over $\lambda/(2 NA)$, the above effect will be more improved. When only the pattern is watched, if the word line pitch is assumed to be PD and adjacent word lines (e.g., DL1 and 1B, as well as DL3 and 3B) are terminated differently in length so as to be shifted from each other at their tips by over PD/2, the above effect will be much more improved. However, when the tips of those word lines are shifted from each other excessively, the chip area must be increased. To avoid such a problem, therefore, the shifting value should be within $\lambda/NA$ or within PD. When the tip of each data lines is cut obliquely, if a vertical side is slightly left at the tip as shown in FIG. 12 so as not to sharpen the tip, the patterning treatment will become much easier for creating the mask data.

According to the present invention, length is changed between adjacent data lines (e.g., DL1 and DL1B, DL3 and DL3B) disposed in units of two lines so as to be shifted from each other at their tips, and the tip of each data line is cut obliquely. Using such masking patterns effectively prevents short failures between the tips of those adjacent word lines, as well as break failures on the word lines (DL0B, DL2, DL2B, and DL4) terminated at the boundary. If the difference of length between adjacent word lines (e.g., DL1 and 1B, as well as DL3 and 3B) is set over $\lambda/(2 NA)$, the above effect will be more improved. When only the pattern is watched, if the word line pitch is assumed to be PD and adjacent word lines (e.g., DL1 and 1B, as well as DL3 and 3B) are terminated differently in length so as to be shifted from each other at their tips by over PD/2, the above effect will be much more improved. However, when the tips of those word lines are shifted from each other excessively, the chip area must be increased. To avoid such a problem, the shifting value should be within $\lambda/NA$ or within PD. When the tip of each data lines is cut obliquely, if a vertical side is slightly left at the tip as shown in FIG. 12(a) so as not to sharpen the tip, the patterning treatment will become much easier for creating the mask data.

Eighth Embodiment

Figure 12B:
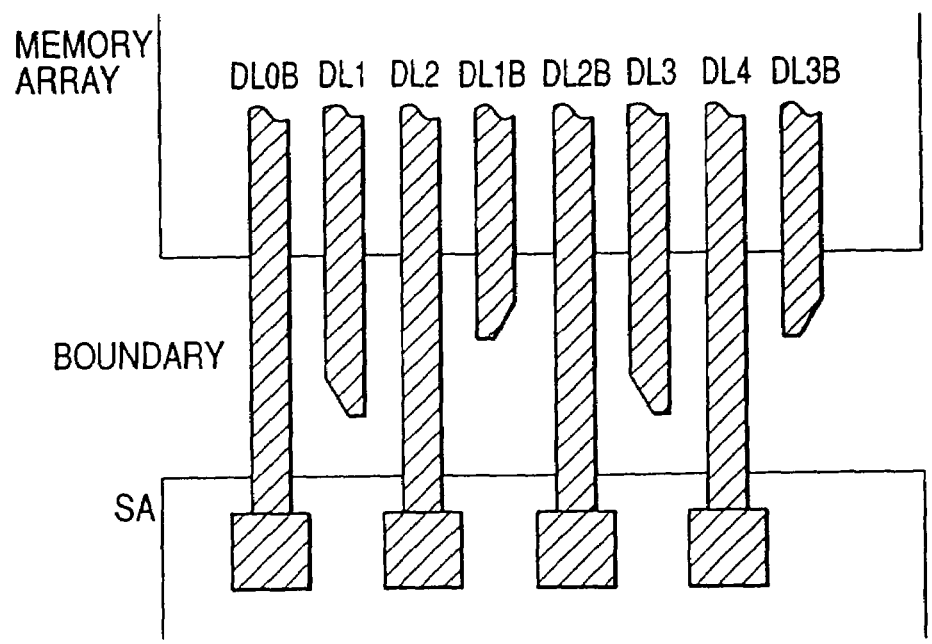

FIG. 12(b) shows the second asymmetrical data lines of the present invention. _A sense amplifier (SA) and a memory array are disposed alternately. Consequently, some data lines (e.g., DL0B, DL2, DL2B, and DL4) pass the boundary between a sense amplifier and a memory array and enter their sense amplifier and others (e.g., DL1, DL1B, DL3, and DL3B) are terminated at the boundary. The data lines repeat this alternately. Such a disposition of data lines is more effective than the disposition of data lines shown in FIG. 12(a) for preventing short and break failures. If the phase shift lithography technique is used for forming data lines, a 0-phase line pattern and a Ø-phase line pattern are disposed alternately. In this case, however, an error will arise from the line width of both 0-phase line pattern and Ø-phase line pattern depending on the optical conditions or the masking pattern treatment. Even in such a case, the same phase is assigned to each pair of data lines (DL1 and DL1B, DL2 and DL2B) connected to the same sense amplifier in the disposition of data lines shown in FIG. 12(b), so the line width becomes equal for both data lines in each pair, as well as occurrence of an unbalance among capacitance of data lines is prevented.

Such a data capacitance unbalance can be neglected even when it occurs, however, since the necessary difference between data lines in the present invention is very small with respect to the length of each data line.

Although description has been made for a DRAM in the above embodiments, the word and data lines of the present invention can also apply to other types of memories, such as flash memories, EEPROMs, masked ROMs, SRAMs, etc.

Ninth Embodiment

Figure 13:
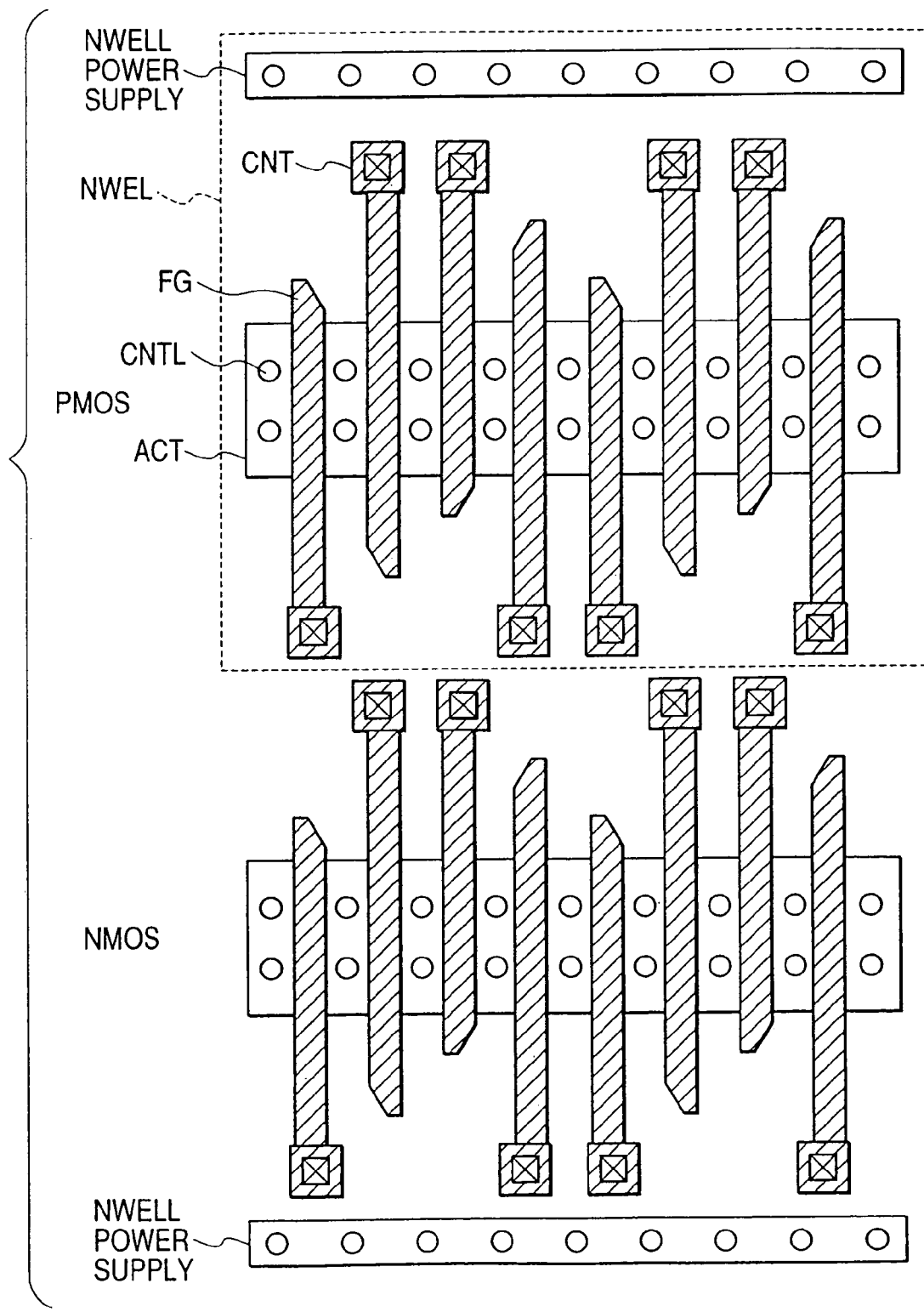
FIG. 13 shows a gate array that uses the asymmetrical gates of the present invention.
Figure 14A:
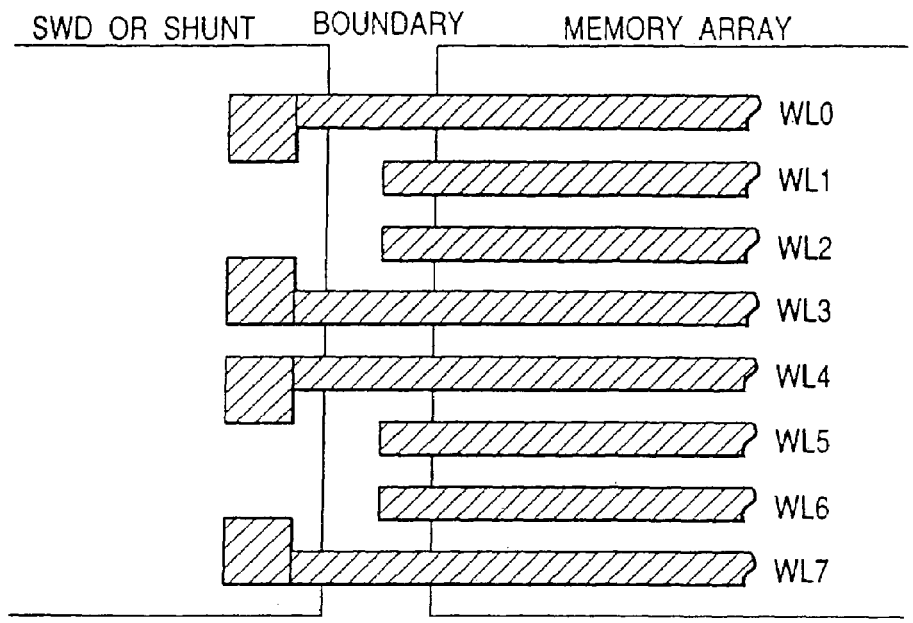
FIG. 14 shows the conventional first word lines.
Figure 14B:
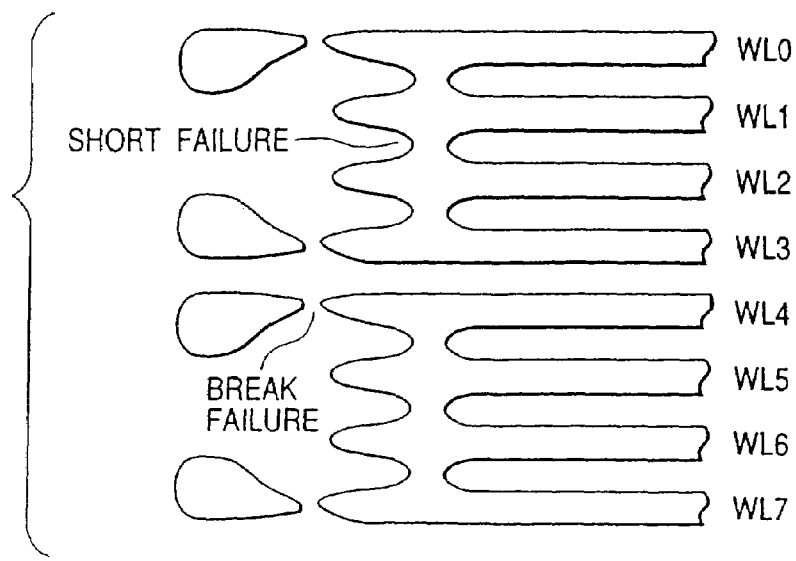
Figure 15A:
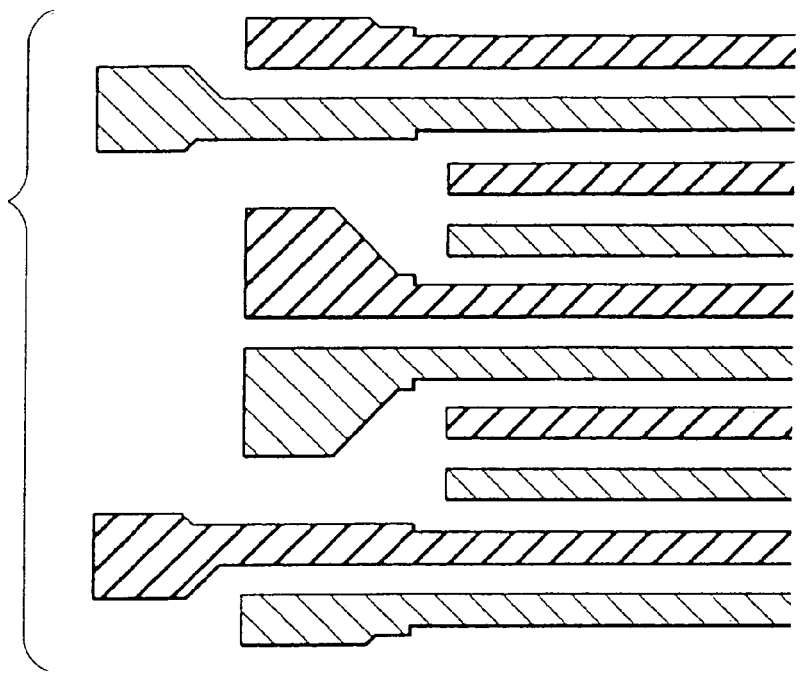
FIG. 15 shows optical simulation results of the conventional word lines.
Figure 15B:
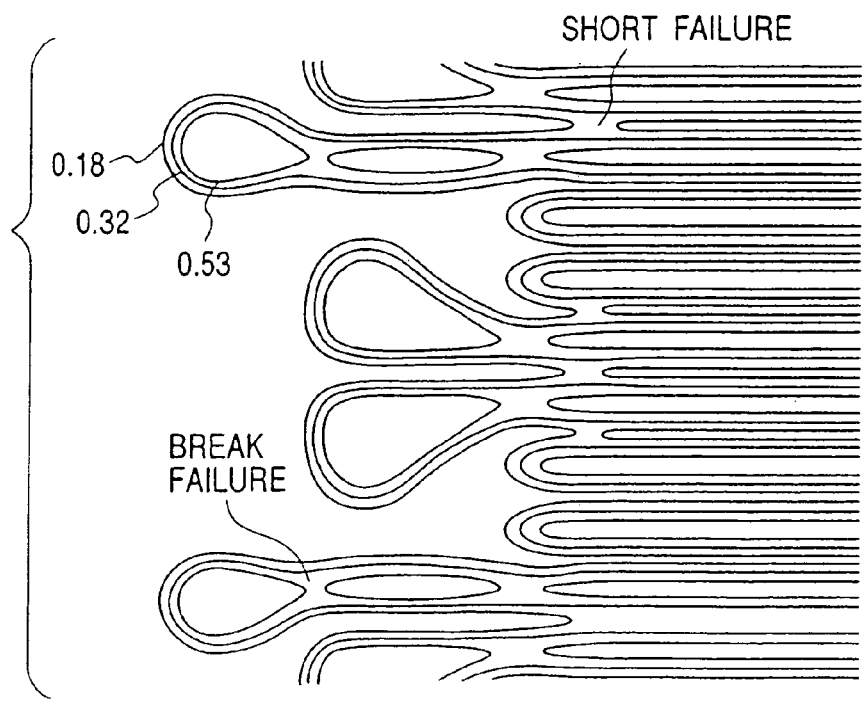

FIG. 13 shows a basic cell of a gate array that uses asymmetrical gates of the present invention. The basic cell is divided into a PMOS transistor disposed area and an NMOS transistor disposed area. PMOS transistors are formed in an N-type well (NWELL). FG indicates the gate of an MOS transistor and ACT indicates an active area of the MOS transistor. CNT indicates a contact between a MOS transistor gate (FG) and the first metallic wiring M1 and CONTL indicates a contact between M1 and ACT.

In the case of the gate array, the semiconductor vendor prepares items up to the basic cells created as shown in FIG. 13. Then, the user layouts M1 or M1, the second metallic wiring M2, and M1-M2 contact thereby to design a desired circuit. In a basic cell, the active areas (ACT) are connected in the horizontal direction and MOS transistor gates (FG) are disposed at regular pitches. A contact (CNTL) is disposed between MOS transistor gates (FG). When separating an element from others, the gate is connected to Vss for an NMOS transistor and to Vcc for a PMOS transistor.

In this embodiment, the dog-bone areas of contacts are disposed alternately in units of two at the upper and lower portions of the ACT, considering that each gate is microstructured thereby to narrow the FG disposition pitch. This method makes it easier to layout dog-bone areas. On the other hand, at the edge of each gate disposed regularly such way, problems of short and break failures just like in the case of the word lines of a memory described above arise.

In order to avoid such problems, in the case of the basic cell of the present invention, length is changed between adjacent MOS transistor gates (FG) so as to be shifted from each other at their tips, and the tip of each gate (FG) is cut obliquely. Using such masking patterns effectively prevents short failures between the tips of those adjacent MOS transistor gates, as well as break failures on those dog-bone areas. If the difference of length between MOS transistor gates is set over $\lambda/(2\ NA)$, the above effect will be more improved. When only the pattern is watched, if the MOS transistor gate pitch is assumed to be PG and those MOS transistor gates (FG) are shifted from each other at their tips by over PG/2, the above effect will be much more improved. However, when the tips of those MOS transistor gates (FG) are shifted from each other excessively, the chip area must be increased. To avoid such a problem, the shifting value should be within $\lambda/NA$ or within PG. When the tip of each FG is cut obliquely, if a vertical side is slightly left at the tip as shown in FIG. 13 so as not to sharpen the tip, the patterning treatment will become much easier for creating the mask data.

What is claimed is:

1. A semiconductor device comprising:
a first wiring extending in a first direction and coupled to a plurality of first memory cells;
a second wiring extending in the first direction and coupled to a plurality of second memory cells;
a third wiring extending in the first direction and coupled to a plurality of third memory cells;
a fourth wiring extending in the first direction and coupled to a plurality of fourth memory cells;
a first contact provided at one end of the first wiring;
a second contact provided at one end of the second wiring;
a third contact provided at one end of the third wiring; and
a fourth contact provided at one end of the fourth wiring,
wherein the plurality of first to fourth memory cells are formed in a first rectangular region,
wherein the first and fourth contacts are formed in a second region, wherein the second and third contacts are formed in a third region,
wherein the first rectangular region is provided between the second region and the third region,
wherein a first side of the first rectangular region extends in a second direction perpendicular to the first direction, and
wherein a distance between the other end of the second wiring and the first side of the first rectangular region is shorter than a distance between the other end of the third wiring and the first side of the first rectangular region.

2. A semiconductor device according to claim 1,
wherein the other end of the second wiring and the other end of the third wiring are formed in a fourth region, and
wherein the fourth region is provided between the first rectangular region and the second region.

3. A semiconductor device according to claim 1, wherein a distance between the first contact and the other side of the first rectangular region and a distance between the fourth contact and the other side of the second region are same length.

4. A semiconductor device according to claim 1, further comprising:
a plurality of sense amplifiers coupled to the first to fourth wirings,
wherein the first to fourth wirings are bit lines.

5. A semiconductor device according to claim 1, further comprising:
a plurality of word drivers coupled to the first to fourth wirings,
wherein the first to fourth wirings are word lines.

6. A semiconductor device according to claim 1, wherein a distance between the other end of the second wiring and the other end of the third wiring in the first direction is longer than a distance between the second wiring and the third wiring in the second direction.

7. A semiconductor device according to claim 1, wherein the plurality of first to fourth memory cells are DRAM memory cells.

8. A semiconductor device according to claim 1, wherein the second and third wirings are adjacent wirings.

* * * * *